(12) United States Patent
Waltz et al.

(10) Patent No.: US 7,428,148 B2
(45) Date of Patent: Sep. 23, 2008

(54) COMPONENT SUPPORT

(75) Inventors: Eike Waltz, Aptos, CA (US); Werner Körber, Betzenstein (DE)

(73) Assignee: RITTAL RES Electronic Systems GmbH & Co. KG, Herborn (DE)

( * ) Notice: Subject to any disclaimer, the term of this patent is extended or adjusted under 35 U.S.C. 154(b) by 243 days.

(21) Appl. No.: 11/448,166

(22) Filed: Jun. 6, 2006

(65) Prior Publication Data

US 2007/0139903 A1    Jun. 21, 2007

(30) Foreign Application Priority Data

Jun. 6, 2005   (DE) ................. 10 2005 026 180

(51) Int. Cl.
*H05K 5/02* (2006.01)

(52) U.S. Cl. ............... 361/685; 257/679; 710/301; 235/375

(58) Field of Classification Search ............... 439/76.1, 439/78, 64, 327; 235/300, 492, 375; 257/679, 257/E23.176; 710/62, 301, 309; 463/16, 463/63; 361/679–687, 724–727, 802, 807
See application file for complete search history.

(56) References Cited

U.S. PATENT DOCUMENTS

| | | | |
|---|---|---|---|
| 5,686,714 A | * | 11/1997 | Abe et al. .................. 235/435 |
| 6,646,890 B1 | | 11/2003 | Byers et al. |
| 2007/0076385 A1 | * | 4/2007 | Korber et al. ............... 361/756 |

* cited by examiner

*Primary Examiner*—Hung V Duong
(74) *Attorney, Agent, or Firm*—Pauley Petersen & Erickson

(57) ABSTRACT

A component support having at least one insert card reception chamber with two insert card guidance devices, which have oppositely located guides for receiving at least one insert card. The guides are arranged and spaced apart from each other by a size of a height of the insert card. Insert cards of different structural height can be installed in the component support if the insert card receptacle is divided at a half of the height between the two guides by a guide rail. The guide rails, together with the guides of the insert card guidance devices, form partial receptacles, into which printed circuit boards of a reduced insert card height can be introduced.

16 Claims, 4 Drawing Sheets

COMPONENT SUPPORT

BACKGROUND OF THE INVENTION

1. Field of the Invention

This invention relates to a component support, having at least one insert card reception chamber with two insert card guidance devices, which have oppositely located guides for receiving at least one insert card, and the guides are arranged and spaced apart from each other by the size of the height of the insert card.

2. Discussion of Related Art

A component support is taught by U.S. Pat. No. 6,646,890. A housing, into which several insert card guidance devices are installed is used. It is possible to introduce insert cards, which lie parallel next to each other, into the insert card guidance devices. The insert cards have a strip of plugs on their back end. With these, the introduced insert card contacts a plug-in receiver, which is attached to a printed circuit board, for example a back plane, maintained on the rear of the housing.

The insert cards have plug-in points for making them individually different or for supplementing their functions, into which additional printed circuit boards can be inserted. For example, the additional printed circuit boards are known as slave boards or mezzanine boards and the open front of the housing they can be introduced into guidance devices and pushed into the plug-in locations.

Current applications for component supports require that the component supports be differently equipped. The component housing must be selected to correspond to the intended application and then equipped with the desired number of insert cards. Because the dimensions of the component housings are pre-fixed, it is possible for some insert card receptacles to remain empty, so that valuable structural space remains unused. With known component supports, the insert cards must have guidance and fastening elements, which are disadvantageous for the layout of the insert cards.

SUMMARY OF THE INVENTION

It is one object of this invention to provide a component support with a simple structure, in which insert cards of various insert card heights can be installed.

This and other objects are attained with an insert card receptacle divided at half the height between the two guides by a guide rail. The guide rails, together with the guides of the insert card guidance devices, form partial receptacles, into which printed circuit boards of a reduced insert card height are introduced.

In accordance with this invention, the insert card receptacle is divided in at least one partial area. In this case, the guide rail with its guides and the guides of the insert card guidance devices are used for receiving insert cards of a reduced structural height. Thus, the insert cards can be maintained clear of guidance or fastening elements, which would interfere with the board layout. The structure of the component support is considerably simplified and makes a modular construction possible.

A simple structure is obtained if the insert card guidance devices are connected with each other by a support element, and if the support element holds the guide rail between the insert card guidance devices.

In addition, the modularity of the component support can be expanded with two or more module supports. Each of the module supports forms an insert card receptacle, wherein a width of the insert card receptacle corresponds to the installation dimension of two insert card widths. With the guide rail the insert card receptacles can be divided into an insert card area of two half insert card heights and an insert card area of a whole insert card height, or can have two or more module supports. Each of the module supports forms an insert card receptacle, wherein a width of the insert card receptacle corresponds to the installation dimensions of two insert card widths, and wherein the insert card receptacle can be divided by the guide rail into two insert card areas of half the insert card height.

In one embodiment of this invention, the module supports can be releasably fastened on a support arranged in the rear so that the removal of a single arbitrary module support from the row of module supports is possible. The insert cards or boards which are inserted into the guides, are electrically connected by plug-in connectors directly with the support. In that case, the component support is assembled or put together from two or more module carriers, each of which has receptacles for modules. The number of module carriers can be selected as a function of the required number of insert cards. It is thus possible to design the dimensions of the component support in accordance with the required applications. The module carriers are arranged together on a rear support, wherein the support simultaneously forms the mechanical and the electrical interface. In order to perform the matching of the component support to the application, it is possible to remove any arbitrary module carrier independently of the remaining module carriers.

Thus, in accordance with this invention there can be a kit, which makes possible the individual design of component supports.

With this embodiment, the anchoring elements form a linear guidance device which makes possible a shifting of the module carriers with respect to each other in the direction of the plane formed by the depth and height directions of the component support, preferably in the direction of the depth of the component support. In that case, the direction of the shift of the module carrier corresponds to the movement of the plug-in connection or the plug-in disconnection.

In one embodiment of this invention, the support at the rear has rows of fastening receivers, matched to each other in a grid-like manner, and the graduation of the grid pattern measurement is matched to the graduation of the fastening receivers or the threaded receivers of the lined-up module carriers.

For component support, the module carriers can have threaded receivers on their front ends facing away from the rear support, and transverse connecting elements extending in the wide direction of the component support can be attached to at least two module carriers of the row of module carriers. The transverse connecting elements can further increase the functionality of the component support. It is possible for the transverse connecting elements to form additional connecting points, for example, or form air guidance devices.

If the support is designed as a wall, the support can also form a rear access protection, or the support can already be a part of a housing of, for example, a switchgear cabinet, in which the component support is installed.

To improve ventilation of the insert cards in a simple manner, the insert card guidance devices can each have at least two guides extending in the direction of the depth of the component support, which are arranged, spaced apart from each other by strips, and openings between the strips and the guides.

For lateral access protection for the insert card, the support element can be embodied as a wall element.

In one embodiment of this invention, the guide rail divides the insert card receptacle at half its height, and insert cards of half height can be inserted into the partial receptacles.

BRIEF DESCRIPTION OF THE DRAWINGS

This invention is explained in greater detail in view of an exemplary embodiment of a component support represented in the drawings, wherein.

DESCRIPTION OF PREFERRED EMBODIMENTS

Figure 1:
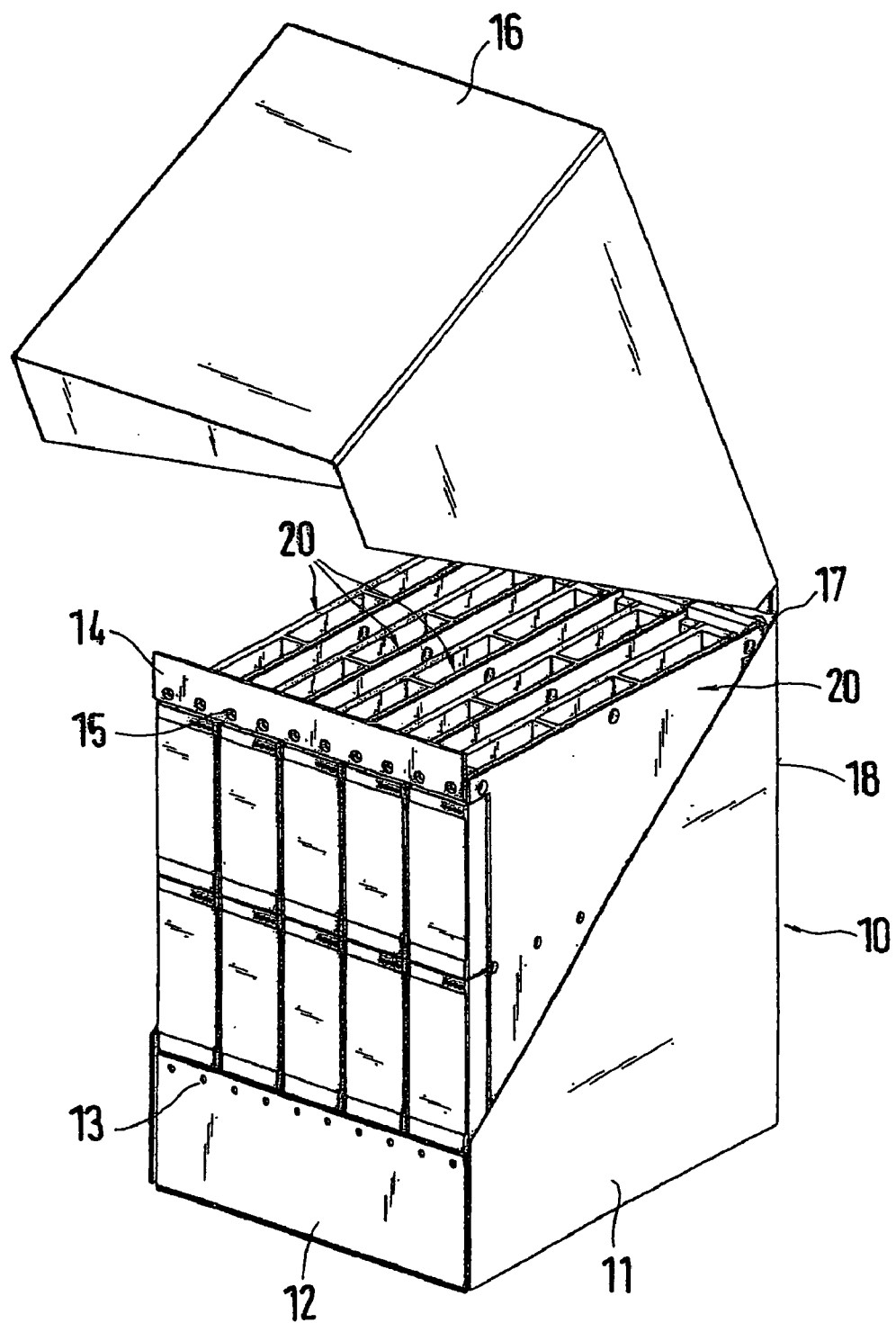
FIG. 1 shows a perspective view of a component support installed in a receiver housing.

A receiver housing 10, into which a component support is introduced, is shown in FIG. 1. The receiver housing 10 has a support 18, which is designed as a wall, at the rear.

Two lateral walls 11 adjoin the support 18 and are connected with each other via a front wall 12 extending parallel relative to the support 18. A cover 16 is fastened on the support 18 by a hinge 17 with a horizontal pivot axis.

The component support, which comprises a plurality of module carriers 20, is introduced into the receiver housing 10. The shape of the module carrier 20 is shown in the representations in accordance with FIGS. 2 to 6. As these drawings show, the module carrier 20 has two insert card guidance devices 30. Each of the insert card guidance devices 30 forms two guides 31. The guides 31 are connected in one piece by strips 32, which extend transversely with respect to the longitudinal direction of the guides 31. Openings are formed between the guides 31 and the strips 32, through which cooling air can circulate. On their ends at the longitudinal sides, the guides 31 are each connected with each other in one piece by a fastening element 34, 35. The fastening elements 34, 35 have threaded receivers 36, which are directed toward the front or the rear.

Figure 2:
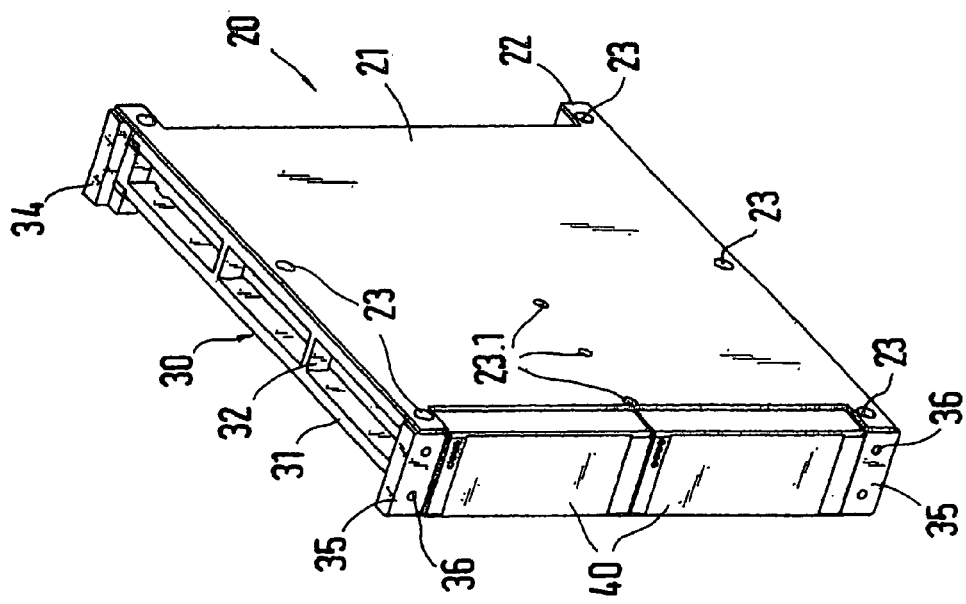
FIG. 2 shows a module carrier, in a perspective view from the right.
Figure 4:
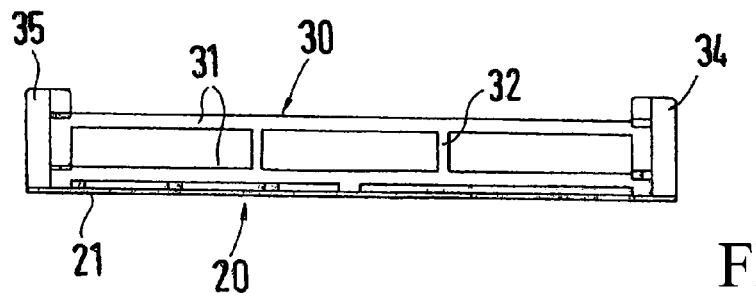
FIGS. 4 to 6 show the module carrier in accordance with FIGS. 2 and 3 in three views, a top view, a front view, and a side view, respectively.
Figure 5:
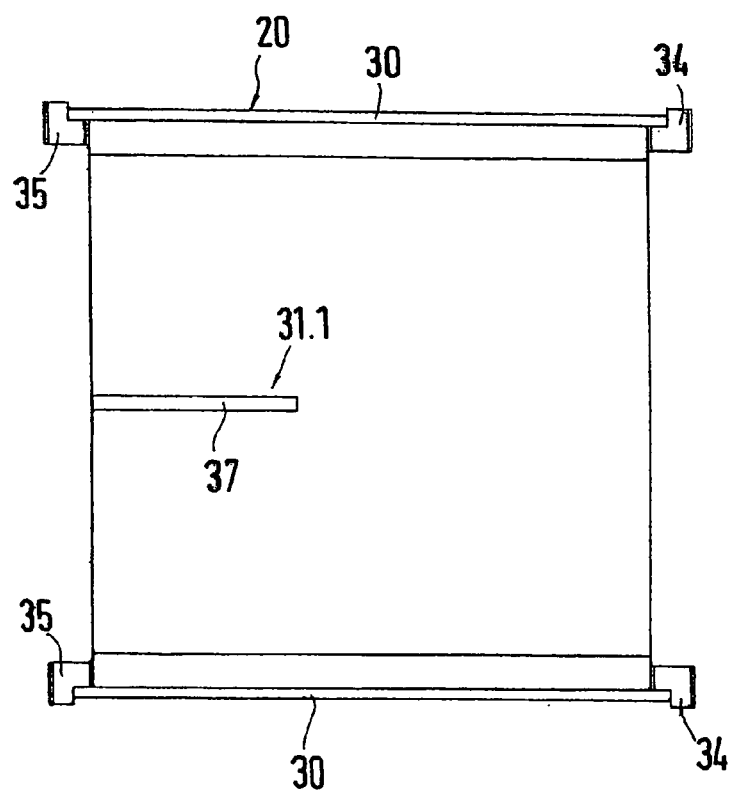

The insert card guidance devices 30 are connected with each other by a support element 21. In this case, the guides 31 are arranged opposite each other and thus form receptacles for insert cards. The insert cards can be displaced in the guides 31 with their horizontal edges in the direction of the depth of the component support. The support element 21 is designed as a wall. As FIG. 2 shows, the support element 21 has screw receivers 23 into which fastenings screws can be inserted and screwed into threaded receivers of the insert card guidance devices 30.

Figure 3:
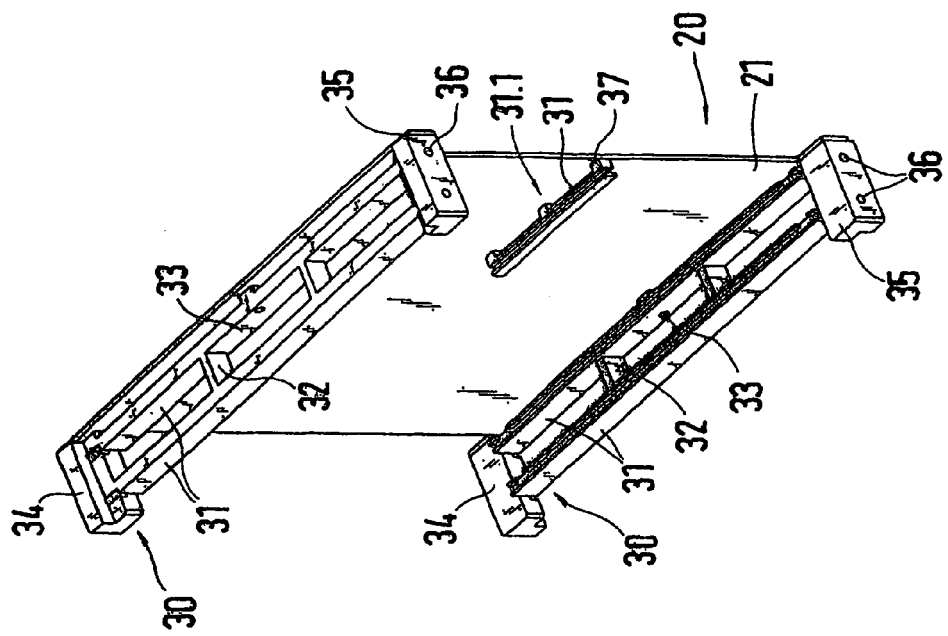
FIG. 3 shows the module carrier shown in FIG. 2, but in a perspective view from the left.
Figure 6:
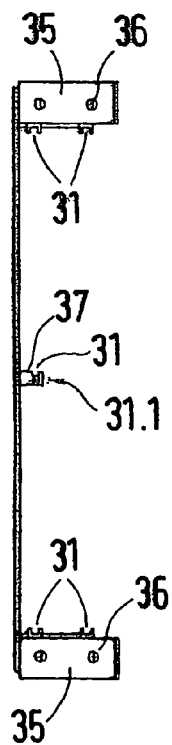

As FIG. 3 shows, centered between the two insert card guidance devices 30, the support element 21 has a further guide rail 31.1 with two guides 31. FIG. 6 shows the guides 31 located opposite the guides 31 of the fastening elements 34, 35 adjoining the support element 21. Spacers are formed on the guide rail 31.1 to maintain the guide rail 31.1 precisely in this position.

Ventilation openings for guiding the cooling air are created between the guide rail 31, the support element 21 and the spacers 37. With their guides 31 and the oppositely located guides 31 of the fastening elements 34, 35, the guide rails 31.1 form receptacles, into which insert cards of half the structural height can be introduced.

The guide rail 31.1 has threaded receivers in its spacers that are aligned with threaded receivers 23.1 of the support element 21, so that simple fastening and exact alignment on the support element 21 is possible.

FIG. 2 shows the support element 21 in detail. The support element 21 has four tabs or necks 22, which protrude toward the front and the rear. Together with the fastening elements 34, 35, receptacles result, into which front plates 40 of the insert cards (not represented) can be set flush. The module carriers 20 shown in FIGS. 2 to 6 have two guides 31 each at the fastening elements 34, 35. However, it is also possible to provide only one, or several guides 31.

Module carriers 20 with one guide 31 or, as shown in FIGS. 2 to 6, two guides 31 can be advantageous for forming a component support. In this case, it is possible to simultaneously install module carriers 20 with different numbers of guides on a component support. In connection with module carriers 20 with two guides 31 and, corresponding thereto with two receptacles for insert cards, it is possible to install insert cards of different formats.

Figure 7:
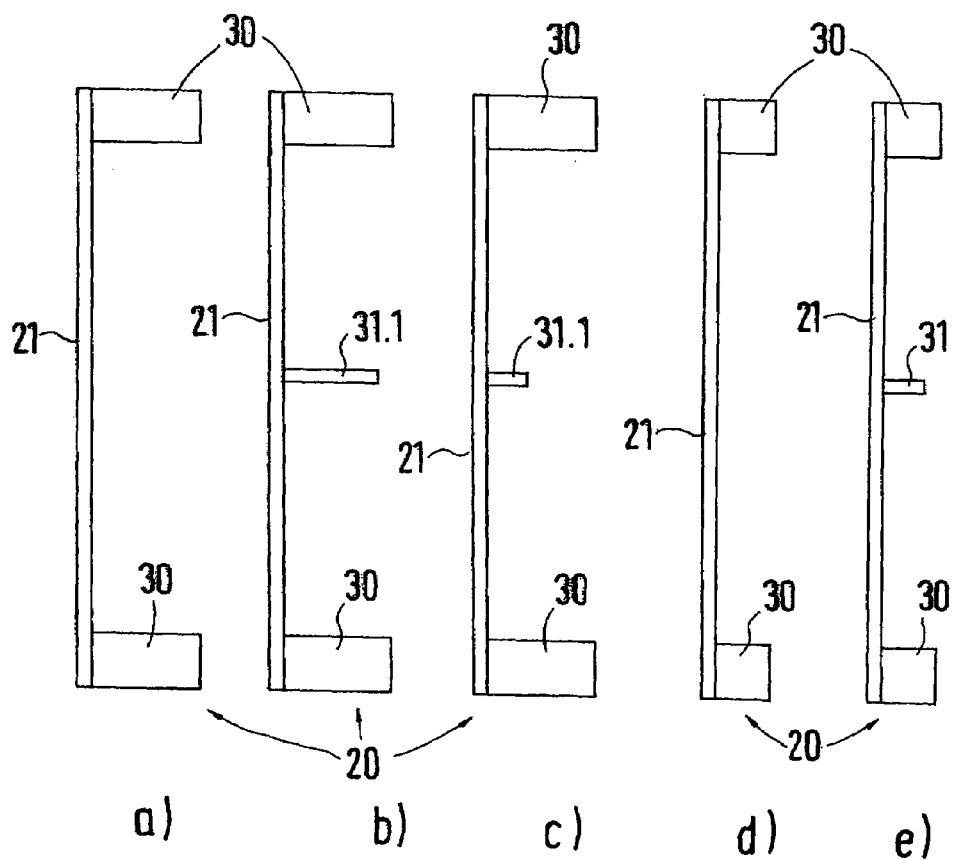
FIG. 7 shows different designs of module carriers, in schematic views.

Module carriers 20 for different insert card formats are shown, by way of example, in FIG. 7. There, the variation a) shows the module carrier 20 which can receive two insert cards which extend over a full or complete installation height. However, it is also possible to install only one insert card which extends over the full height and the entire available width on the installation space of the module carrier 20, and thus they are referred to as insert cards of single height and double width. In connection with the variation b) a guide rail 31.1 is installed, which extends over twice the width and thus has four guides 31.

Accordingly, it is possible to install four insert cards of half the height and a single width, or two insert cards of half the height and a double width in this module carrier 20.

The module carrier 20 in accordance with variation c) corresponds to the design in accordance with FIGS. 2 to 6. It is possible to insert two insert cards of half the height and one of full height, but each of half the width, in this module carrier 20. Alternatively, two insert cards of double width and half the height can also be used.

In the variations d) and e), receptacles are formed on the module carrier 20, which extend over the full height, but only over the single width. With the variation d) a high insert card, and with the variation e) two half-high insert cards can be installed.

As FIGS. 2 and 3 show, the module carriers 20 can have flat surfaces on the support element 21 on the side facing away from the insert card guidance devices 30, such as that correspond with flat surfaces of the fastening elements 34, 35.

Thus, the flat surfaces form mechanical interfaces, by which the module carriers 20 can be placed side-by-side. The module carriers 20 can be installed on the rear of a support 18. The support 18 can be a back plane, a mid plane, a profiled element or, for example in accordance with FIG. 1, a housing wall.

The connection with the support 18 is provided via the rear fastening elements 34. The support 18 has screw receptacles, which are arranged flush with the threaded receivers 36 of the fastening elements 34. The module carriers 20 can be fixed in place on the rear of the support 18 by fastening screws, which are passed through the screw receptacles and screwed into the threaded receivers 36. The screw receivers can be applied on the support 18 in the graduation grid corresponding to the graduation grid of the threaded receivers 36 so that the module carriers 20 can be lined up at their mechanical interfaces.

As FIG. 1 shows, the lined-up module carriers 20 can be connected with additional components in the area of or near the front connecting elements 35.

For example, the module carriers 20 can be connected with each other at the lower fastening elements 35 by a transverse support in the broad direction of the component support. In this case, the transverse support can be formed by the front wall 12 of the receiver housing 10. Thus, the front wall 12 can have screw receptacles 13 into which the fastening screws can be inserted and screwed into the flush threaded receptacles 36.

An air guide element is fastened on the upper fastening elements 35.

German Patent Reference 10 2005 026 180.9, the priority document corresponding to this invention, and its teachings are incorporated, by reference, into this specification.

What is claimed is:

1. A component support having at least one insert card reception receptacle with two insert card guidance devices (30) having oppositely located guides (31) for receiving at least one insert card, wherein the guides (31) are spaced apart from each other by a size of a height of the at least one insert card, the component support comprising:
    the at least one insert card receptacle divided at a half height between the two guides (31) by a guide rail (31.1), and
    the guide rail (31.1) together with the guides (31) of the insert card guidance devices (30) forming partial receptacles into which printed circuit boards of a reduced insert card height can be introduced.

2. The component support in accordance with claim 1, wherein the insert card guidance devices (30) are connected with each other by a support element (21) that holds the guide rail (31.1) between the insert card guidance devices.

3. The component support in accordance with claim 2, wherein at least two module supports (20) each forms the insert card receptacle, a width of the insert card receptacle corresponds to an installation dimension of two insert card widths, and with the guide rail (31.1) the insert card receptacle is divided into an insert card area of two half insert card heights and an insert card area of an entire insert card height.

4. The component support in accordance with claim 3, wherein the module supports (20) are releasably fastened on a support (18) arranged in a rear for a removal of a single arbitrary module support (20) from the row of module supports (20).

5. The component support in accordance with claim 4, wherein the insert cards inserted into the guides (31) are electrically connected by plug-in connectors directly with the component support.

6. The component support in accordance with claim 2, wherein at least two module supports (20) each forms the insert card receptacle, wherein a width of the insert card receptacle corresponds to installation dimensions of two insert card widths, and the insert card receptacle is divisible by the guide rail (31.1) into two insert card areas of the half the insert card height.

7. The component support in accordance with claim 6, wherein the module supports (20) are releasably fastened on a support (18) arranged in a rear for a removal of a single arbitrary module support (20) from the row of module supports (20).

8. The component support in accordance with claim 7, wherein the insert cards inserted into the guides (31) are electrically connected by plug-in connectors directly with the component support.

9. The component support in accordance with claim 8, wherein the insert card guidance devices (30) each has at least two of the guides (31) extending in a direction of a depth of the component support, which are spaced apart from each other by strips (32), and openings are formed between the strips (32) and the guides (31).

10. The component support in accordance with claim 9, wherein the support element (21) is formed as a wall element.

11. The component support in accordance with claim 10, wherein the guide rail (31.1) divides the insert card receptacle at a half height, and insert cards of the half height are insertable into the partial receptacles.

12. The component support in accordance with claim 2, wherein at least two module supports (20) each forms the insert card receptacle, wherein a width of the insert card receptacle corresponds to installation dimensions of two insert card widths, and the insert card receptacle is divisible by the guide rail (31.1) into two insert card areas of the half the insert card height.

13. The component support in accordance with claim 1, wherein at least two module supports (20) each forms the insert card receptacle, a width of the insert card receptacle corresponds to an installation dimension of two insert card widths, and with the guide rail (31.1) the insert card receptacle is divided into an insert card area of two half insert card heights and an insert card area of an entire insert card height.

14. The component support in accordance with claim 1, wherein the insert card guidance devices (30) each has at least two of the guides (31) extending in a direction of a depth of the component support, which are spaced apart from each other by strips (32), and openings are formed between the strips (32) and the guides (31).

15. The component support in accordance with claim 1, wherein the support element (21) is formed as a wall element.

16. The component support in accordance with claim 1, wherein the guide rail (31.1) divides the insert card receptacle at a half height, and insert cards of the half height are insertable into the partial receptacles.

* * * * *